(12) United States Patent
Houston

(10) Patent No.: US 8,310,860 B1
(45) Date of Patent: *Nov. 13, 2012

(54) SRAM STRAP ROW DOUBLE WELL CONTACT

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 13/301,287

(22) Filed: Nov. 21, 2011

Related U.S. Application Data

(60) Provisional application No. 61/418,348, filed on Nov. 30, 2010.

(51) Int. Cl.
*G11C 11/00* (2006.01)
(52) U.S. Cl. .................... 365/154; 365/230.08; 438/223; 257/E21.63
(58) Field of Classification Search .................. 365/154, 365/230.08; 438/223; 257/E21.63
See application file for complete search history.

(56) References Cited

U.S. PATENT DOCUMENTS

| | | | | | |
|---|---|---|---|---|---|
| 5,166,902 | A | * | 11/1992 | Silver | 365/182 |
| 5,896,313 | A | * | 4/1999 | Kao et al. | 365/177 |
| 6,005,797 | A | * | 12/1999 | Porter et al. | 365/156 |
| 6,285,088 | B1 | * | 9/2001 | Madan | 257/202 |
| 6,569,723 | B2 | * | 5/2003 | Liaw | 438/153 |
| 7,906,389 | B2 | * | 3/2011 | Liaw | 438/223 |

OTHER PUBLICATIONS

U.S. Appl. No. 13/301,132, entitled "SRAM Strap Row Well Contact", filed Nov. 21, 2011.
U.S. Appl. No. 13/301,217, entitled "SRAM Strap Row Substrate Contact," filed Nov. 21, 2011.

* cited by examiner

*Primary Examiner* — Connie Yoha
(74) *Attorney, Agent, or Firm* — Rose Alyssa Keagy; Wade J. Brady, III; Frederick J. Telecky, Jr.

(57) ABSTRACT

An integrated circuit containing an SRAM array having a strap row. The strap row has a well tap active area that partially overlaps adjacent first polarity wells and a second polarity well that is located between the adjacent first polarity wells. A well contact plug is disposed on a top surface of a tap layer located within the well tap active area.

9 Claims, 5 Drawing Sheets

SRAM STRAP ROW DOUBLE WELL CONTACT

CROSS-REFERENCE TO RELATED APPLICATIONS

This application claims the benefit of priority under U.S.C. §119(e) of U.S. Provisional Application 61/418,348, entitled "SRAM Strap Row Well Contact Overlapping a Well"), filed Nov. 30, 2010, the entirety of which is incorporated herein by reference.

Furthermore, this application is related to:

Patent application Ser. No. 13/301,132, filed (Nov. 21, 2011) entitled "SRAM STRAP ROW WELL CONTACT," and Patent application Ser. No. 13/301,217, filed Nov. 21, 2011) entitled "SRAM STRAP ROW SUBSTRATE CONTACT."

With their mention in this section, these patent applications are not admitted to be prior art with respect to the present invention; patent application Ser. No. 13/301,287, filed Nov. 21, 2011).

BACKGROUND OF THE INVENTION

This invention relates to the field of integrated circuits. More particularly, this invention relates to the strap row of static random access memories (SRAMs) in integrated circuits.

DETAILED DESCRIPTION

Figure 1A:
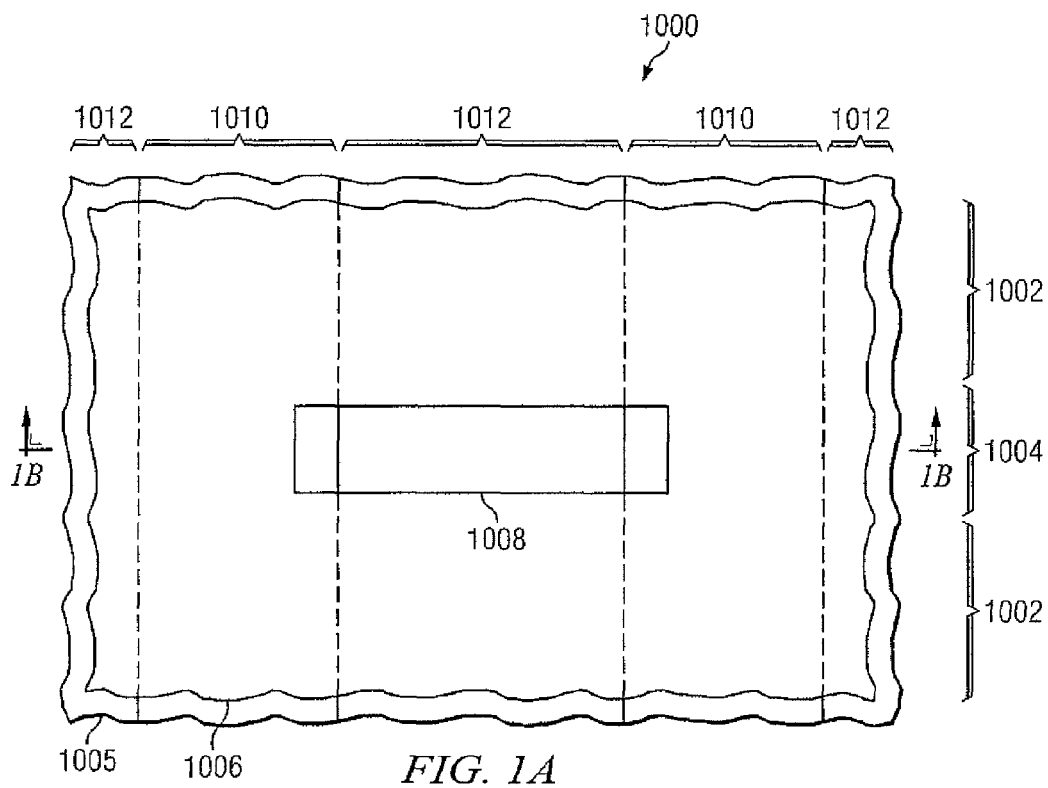
FIG. 1A through FIG. 1F are top views and cross sections of an integrated circuit containing an SRAM array with a strap row that includes a well contact structure.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

A static random access memory (SRAM) cell includes a first set of p-type semiconductor regions which contain n-channel metal oxide semiconductor (NMOS) transistors, and a second set of n-type semiconductor regions which contain p-channel metal oxide semiconductor (PMOS) transistors. In a commonly used configuration of an SRAM cell formed on a monolithic p-type substrate, the p-type regions are directly contacting the substrate so that the p-type regions are electrically connected to other p-type regions through the substrate. In this configuration, the p-type regions may be referred to as p-wells (or as substrate regions) and the n-type regions may be referred to as n-wells. In an alternate configuration of an SRAM cell formed on a monolithic n-type substrate, in which the n-type regions are directly contacting the substrate, the n-type regions may be referred to as n-wells (or as substrate regions) and the p-type regions may be referred to as p-wells.

In another configuration where an SRAM cell is formed on a monolithic p-type substrate, the p-type regions may be electrically isolated from the substrate by a deep n-well that is sometimes referred to as an isolation n-well. This isolation n-well may directly contact (thereby electrically connecting) the n-type regions. Alternatively, the SRAM may be formed on a monolithic n-type substrate where the n-type regions may be electrically isolated from the substrate by a deep p-well that is sometimes referred to as an isolation p-well. This isolation p-well may directly contact (thereby electrically connecting) the p-type regions. In a further configuration, an SRAM may be formed on a silicon-on-insulator (SOI) substrate. In each of these configurations, the p-type regions are called p-wells and the n-type regions are called n-wells.

For the purposes of this disclosure, the active areas are understood to be areas of a semiconductor wafer that are located in openings of a field oxide layer. Active areas having a same conductivity type as the wells under the active areas are referred to as tap areas. Therefore, a tap layer may be created to form a contact to an underlying well; thereby electrically connecting a contact plug formed on the surface of the tap layer to a well that is located under the active area.

FIG. 1A through FIG. 1F are top views and cross sections of an integrated circuit containing an SRAM array with a strap row that includes a well contact structure that is formed according to an embodiment (and depicted in successive stages of fabrication). Referring to the top view of FIG. 1A, an integrated circuit 1000 contains a portion of an SRAM array that includes areas defined for SRAM cell rows 1002 and an area defined for a strap row 1004. Each SRAM cell row 1002 will typically contain a plurality of rows of SRAM cells. A layer of field oxide 1006 is formed at a top surface 1003 of a substrate 1005 in and on which the integrated circuit 1000 is formed. An opening in the field oxide layer 1006 provides a well tap active area 1008 in the strap row 1004.

First polarity wells 1010 may be formed by ion implanting a well dopant species of the first polarity into the substrate 1005 of the integrated circuit 1000. The first polarity wells 1010 alternate with second polarity wells 1012 in this embodiment. The first polarity wells 1010 have an opposite conductivity type from the second polarity wells 1012. For example, in an embodiment formed on a monolithic p-type substrate 1005 that doesn't contain an isolation well, the first polarity wells 1010 may be n-type while the second polarity wells 1012 may be p-type and thereby electrically connected to the substrate 1005. It will be recognized that an operation to provide doping to the second polarity wells 1012, such as a well implant operation, may be optional and may not be performed in all versions of the instant embodiment.

In the instant embodiment, both the first polarity wells 1010 and the second polarity wells 1012 cross the strap row 1004 and extend into adjacent SRAM cell rows 1002. The well tap active area 1008 extends from the second polarity well 1012 within the strap row 1004 to adjacent first polarity wells 1010 within the strap row 1004.

Figure 1B:
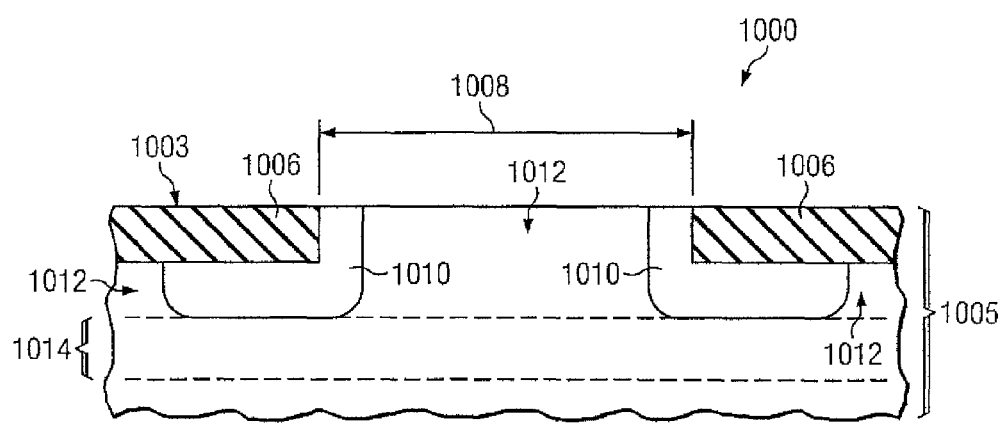

As shown in FIG. 1B (which is a cross section along the section line 1B-1B of FIG. 1A), the field oxide 1006 is formed at a top surface 1003 of the substrate 1005. A portion of the substrate 1005 that underlies the first polarity wells 1010 and the second polarity wells 1012—and has the same conductivity as the second polarity wells 1012—is referred to in this description as a connecting layer 1014. In a version of the instant embodiment in which the second polarity well 1012 has the same conductivity type as the substrate 1005, the connecting layer 1014 may extend to the bottom surface of the substrate 1005. In another version of the instant embodiment in which an isolation well is formed below the SRAM array (with the opposite conductivity type from the substrate 1005), the connecting layer 1014 may be the portion of the isolation well that is below both the first polarity wells 1010 and the second polarity wells 1012. In yet another version of the instant embodiment that is formed on an SOI substrate, the connecting layer 1014 may not be present.

The layer of field oxide 1006 has an opening for the well tap active area 1008. A portion of each adjacent first polarity well 1010 extends into the well tap active area 1008. A bottom surface of the first polarity wells 1010 is below a bottom surface of the field oxide 1006. A second polarity well 1012 extends between adjacent first polarity wells 1010, while the connecting layer 1014 extends under the first polarity wells 1010 to electrically connect adjacent second polarity wells 1012.

Figure 1C:
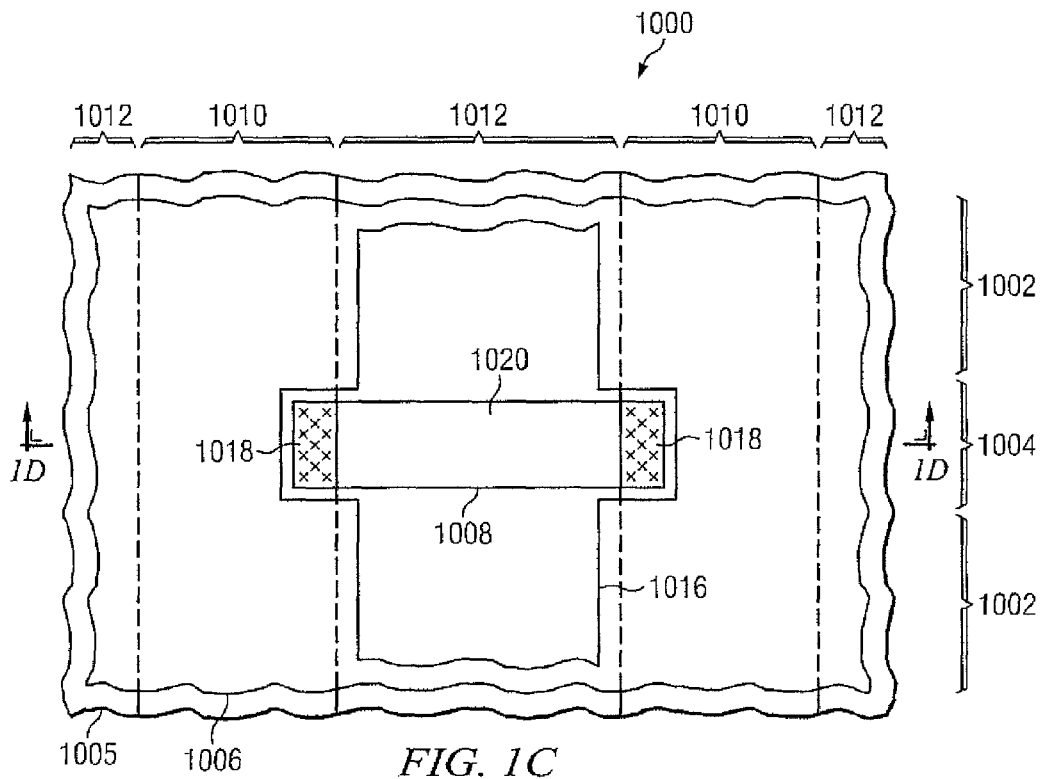

Referring to the top view of FIG. 1C, a patterned SRAM implant mask 1021 (not shown in FIG. 1C but shown in FIG. 1D) is formed over the integrated circuit 1000 to expose the top surface 1003 of the integrated circuit 1000 in an SRAM source/drain/tap area 1016. The SRAM source/drain/tap area 1016 extends continuously in the second polarity well 1012 across the strap row area 1004 and into the adjacent SRAM cell rows 1002. In addition, the SRAM source/drain/tap area 1016 fully covers the well tap active area 1008 in the strap row 1004. The SRAM source/drain/tap area 1016 is depicted with a stipple pattern in FIG. 1C and FIG. 1F.

An ion implant process may be performed to implant source/drain/tap dopants into the integrated circuit 1000 within the SRAM source/drain/tap area 1016 so as to form source and drain regions for the transistors in the SRAM cells in the second polarity well 1012. The implanted source/drain/tap dopants also create a tap layer 1020 in the substrate tap active area 1008. In the instant embodiment, the tap layer 1020 has the same conductivity type as the second polarity wells 1012. The tap layer 1020 overlaps adjacent first polarity wells 1010 to form tap overlap areas 1018. The tap overlap areas 1018 (depicted in FIGS. 1C-1F with an "x" fill pattern) provide electrical connections to the first polarity wells 1010.

Figure 1D:
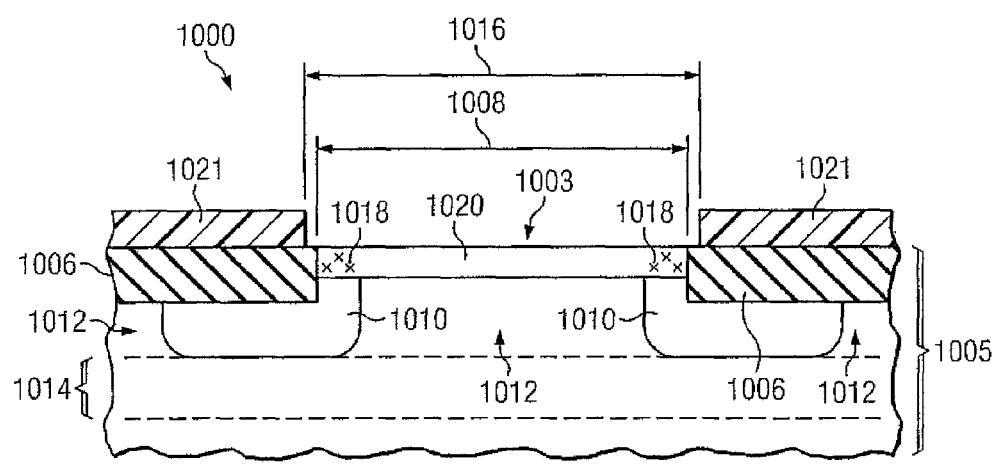

As shown in FIG. 1D (which is a cross section along the section line 1D-1D of FIG. 1C), the tap layer 1020 is formed at the existing top surface of the integrated circuit 1000 in the well tap active area 1008 so as to form the tap overlap areas 1018 within the adjacent first polarity wells 1010. In the instant embodiment, the tap layer 1020 does not extend below the layer of field oxide 1006. As noted supra, the tap overlap areas 1018 in which the tap layer 1020 overlaps the adjacent first polarity wells 1010 in the well tap active area 1008 are depicted in FIG. 1D with an "x" fill pattern.

Figure 1E:
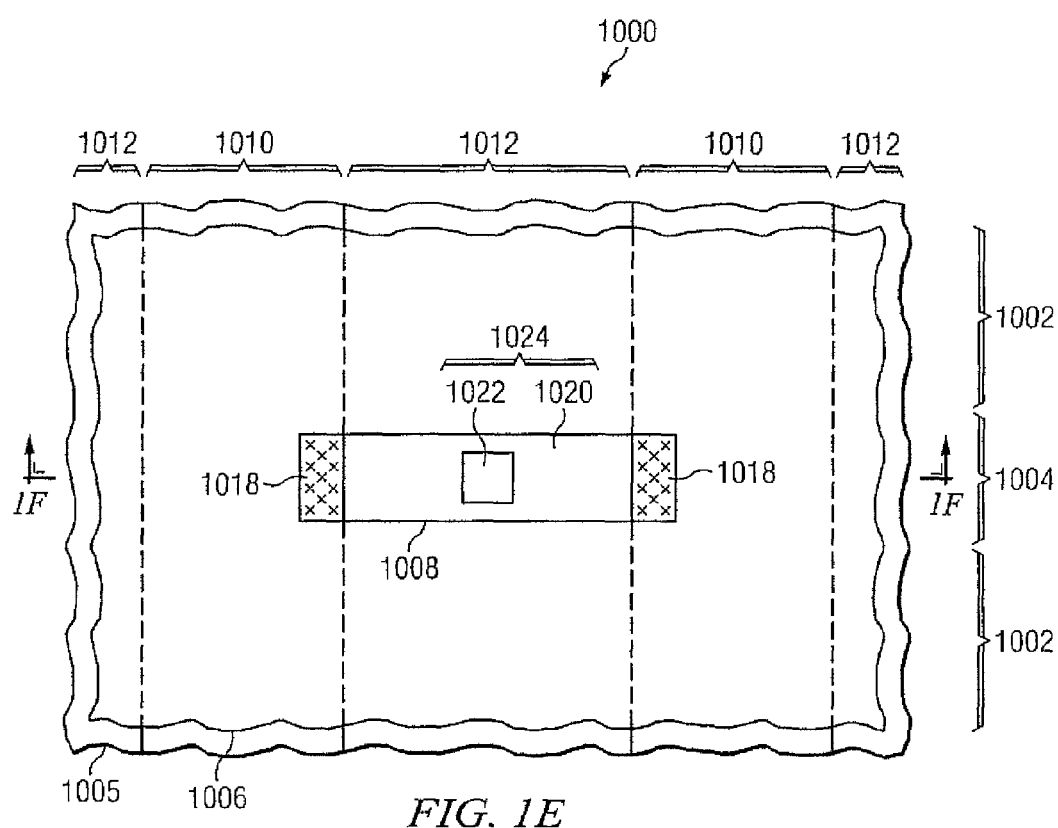

Referring to the top view of FIG. 1E, a well contact plug 1022 is formed on the top surface 1003 of the tap layer 1020 in the well tap active area 1008. The well contact plug 1022 and the tap layer 1020 form a well contact structure 1024.

Figure 1F:
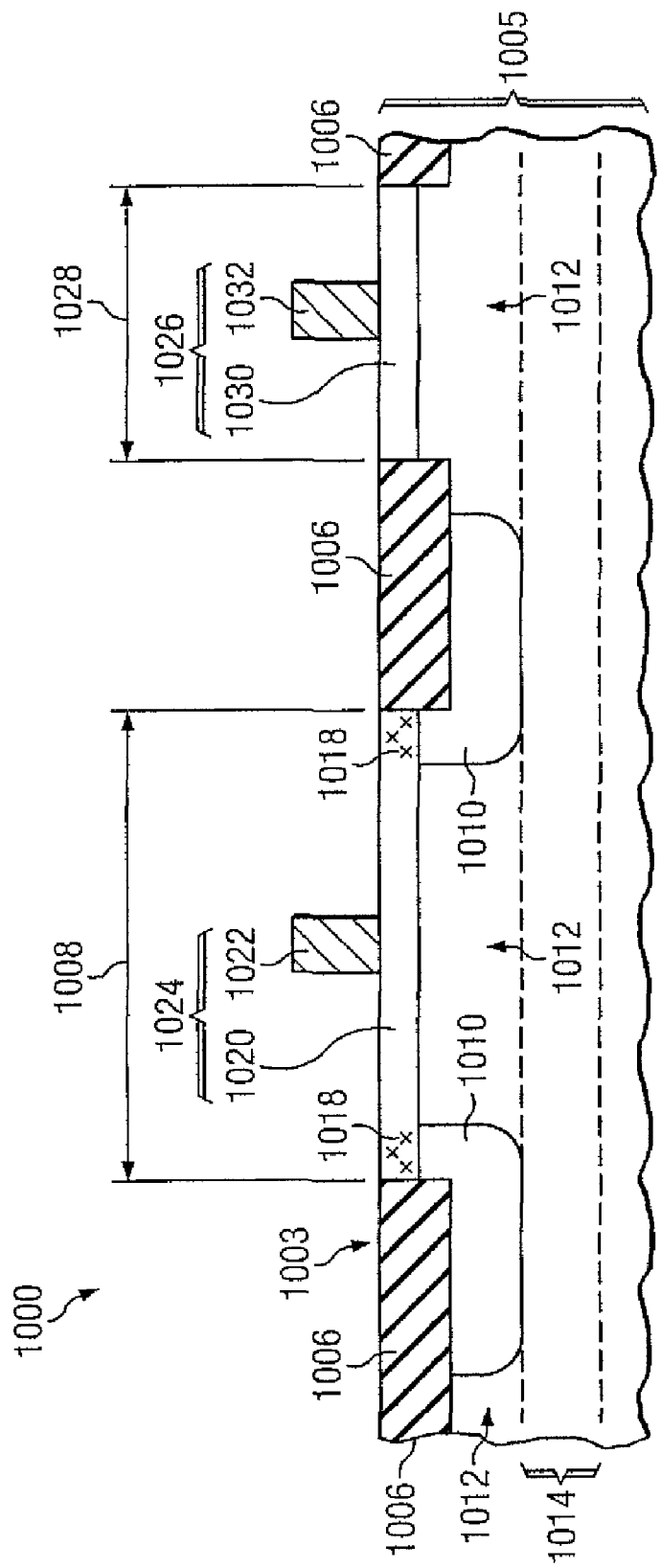

As shown in FIG. 1F (which is a cross section along the section line 1F-1F of FIG. 1E), the well contact plug 1022 is formed on the top surface 1003 of the tap layer 1020 so as to provide an electrical connection between the well contact plug 1022 and the first polarity wells 1010 (by way of the tap overlap areas 1018). The top surface of the tap layer 1020 may also include a thin layer of metal silicide or other electrically conductive material (not shown).

The strap row area 1004 containing the well contact structure may be narrower (e.g. less distance between SRAM cell rows 1002) than a strap row area containing a well contact structure that does not overlap adjacent wells and intervening substrate region. The narrower strap row shown in FIG. 1E may provide a reduction of a total area occupied by the SRAM array within the integrated circuit 1000. It will be recognized that a strap row 1004 may contain more than one instance of the well contact structure 1024.

A second polarity well contact structure 1026 that makes electrical connection to an instance of the second polarity wells 1012 is also depicted in FIG. 1F. The second polarity well contact structure 1026 may include, for example, a second polarity tap layer 1030 (located within a second polarity well tap active area 1028) having the same conductivity type as the second polarity wells 1012. The second polarity well contact structure 1026 may also include a second polarity well contact plug 1032 that is on the top surface 1003 of the substrate 1005 over the second polarity tap layer 1030. Instances of the second polarity well contact structure 1026 may be disposed within the strap row 1004 along with instances of the well contact structure 1024.

Figure 2:
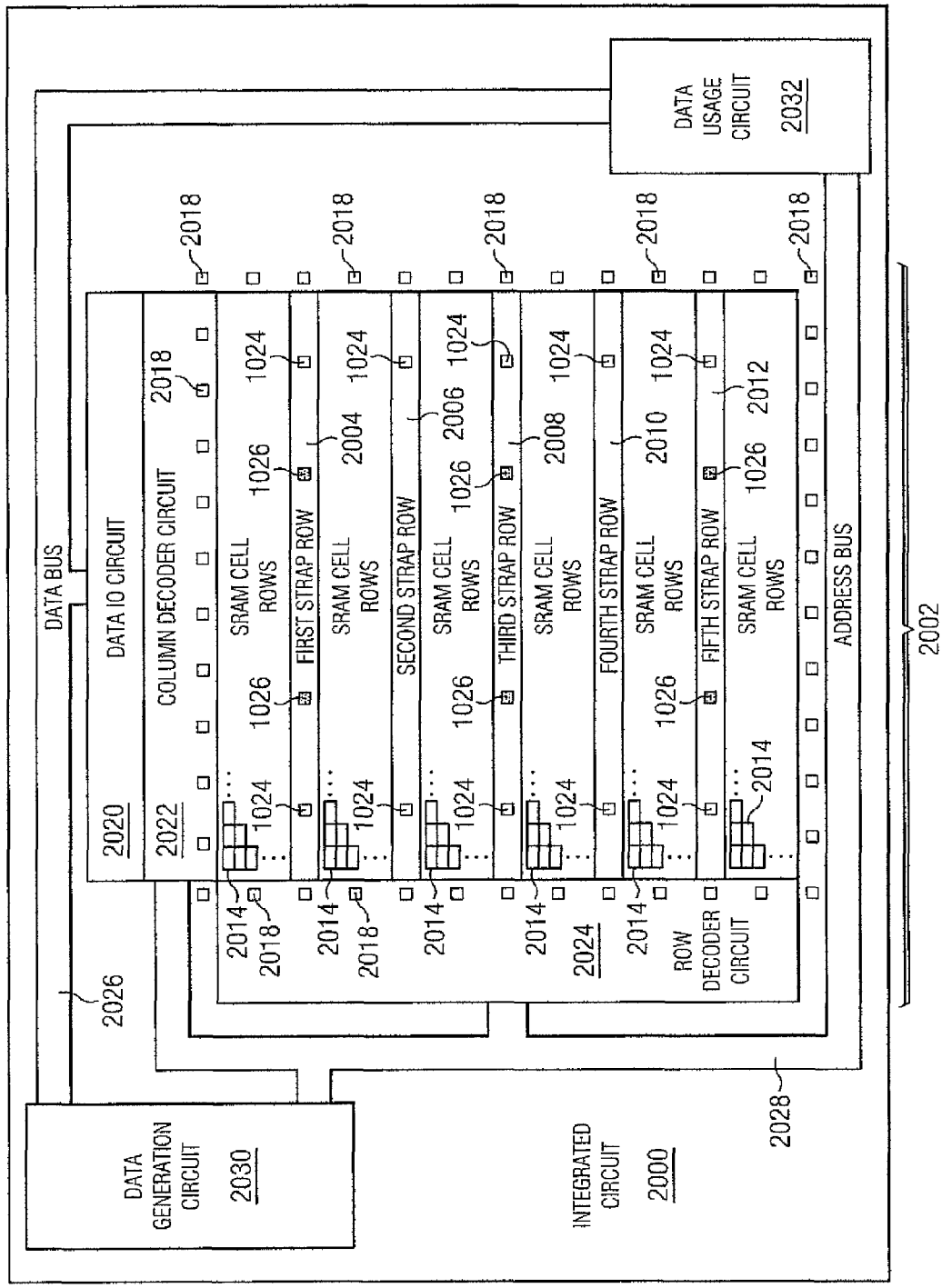
FIG. 2 is a top view of an integrated circuit containing an SRAM array which includes one or more strap rows.

FIG. 2 is a top view of an integrated circuit 2000 containing an SRAM array 2002 which includes one or more strap rows 2004, 2006, 2008, 2010, 2012. Rows of SRAM cells 2014 are formed between the strap rows 2004, 2006, 2008, 2010, 2012. In one version of the instant embodiment, all of the strap rows 2004, 2006, 2008, 2010, 2012 may have substantially identical configurations of the well contact structures 1024 discussed in reference to FIG. 1A through FIG. 1F. In another version of the instant embodiment, the strap rows 2004, 2006, 2008, 2010, 2012 may have different numbers of instances of well contact structures. For example, strap rows 2004, 2008 and 2012, may contain well contact structures 1024 plus second polarity well contact structures 1026 (as shown in FIG. 1F). Conversely, strap rows 2006 and 2010 may contain well contact structures 1024 but no instances of second polarity well contact structures 1026. Additionally, peripheral second polarity well contact structures 2018 may be formed at a periphery of the SRAM cells 2014 to provide electrical connection to the second polarity wells of the rows of SRAM cells 2014.

A data input/output (JO) circuit 2020 is usually located adjacent to the rows of SRAM cells 2014. The data IO circuit 2020 writes data bits to and reads data bits from the SRAM cells 2014. A column decoder circuit 2022 is also usually located adjacent to the rows of SRAM cells 2014 and controls entire columns of SRAM cells. In addition, a row decoder circuit 2024 is usually located adjacent to the rows of SRAM cells 2014 and controls entire rows of SRAM cells 2014. The column decoder circuit 2022 and the row decoder circuit 2024 select the proper SRAM cells 2014 for each read and write operation.

The integrated circuit 2000 further includes a data bus 2026 that interfaces to the data 10 circuit 2020, possibly to a data generation circuit 2030, and also possibly to a data usage circuit 2032. The integrated circuit also includes an address bus 2028 that is connected to the row decoder circuit 2024 and the column decoder circuit 2022. In addition, the address bus 2028 may interface to the data generation circuit 2030 and to the data usage circuit 2032.

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit containing an SRAM array, comprising:
    a substrate of said integrated circuit;
    an SRAM cell row disposed in said SRAM array, said SRAM cell row area containing a plurality of rows of SRAM cells;
    a strap row disposed in said SRAM array and located adjacent to said SRAM cell row;
    a layer of field oxide disposed at a top surface of said SRAM array;
    a first instance of a first polarity well of a first conductivity type disposed in said substrate, said first instance of said first polarity well extending through said SRAM cell row and said strap row;
    a second instance of said first polarity well of said first conductivity type disposed in said substrate, said second instance of said first polarity well extending through said SRAM cell row and said strap row;
    a second polarity well of a second conductivity type disposed in said substrate at a location between said first instance of said first polarity well and said second instance of said first polarity well, said second conductivity type being opposite from said first conductivity type;
    a well tap active area located in said strap row and disposed within an opening in said layer of field oxide, said well tap active area extending across said second polarity well located within said strap row, said well tap active area also partially overlapping said first instance of said first polarity well located within said strap row and said second instance of said first polarity well located within said strap row;
    a tap layer having said first conductivity type disposed in said well tap active area, said tap layer partially overlapping said first instance of said first polarity well so as to provide an electrical connection to said first instance of said first polarity well, said tap layer also partially overlapping said second instance of said first polarity well so as to provide an electrical connection to said second instance of said first polarity well; and
    a well contact plug located on a top surface of said tap layer in said well tap active area, so that a combination of said tap layer and said well contact plug forms a well contact structure.

2. The integrated circuit of claim 1, in which said strap row further includes a second polarity well contact structure coupled to said second polarity well.

3. The integrated circuit of claim 1, in which said SRAM array further includes a peripheral second polarity contact structure coupled to said second polarity well at a location that is peripheral to said SRAM cell row.

4. The integrated circuit of claim 1, in which:
    said first polarity well is n-type; and
    said second polarity well is p-type.

5. The integrated circuit of claim 1, in which said strap row is free of a second polarity well contact structure coupled to said second polarity well.

6. The integrated circuit of claim 1, further including:
    a data input/output circuit coupled to said SRAM cell row;
    a data bus coupled to said data input/output circuit; and
    a data generation circuit coupled to said data input/output circuit.

7. The integrated circuit of claim 1, further including:
    a data input/output circuit coupled to said SRAM cell row;
    a data bus coupled to said data input/output circuit; and
    a data usage circuit coupled to said data input/output circuit.

8. The integrated circuit of claim 1, further including:
    a second SRAM cell row area disposed in said SRAM array, said second SRAM cell row area containing a plurality of rows of SRAM cells, such that a second instance of said second polarity well extends through said second SRAM cell row area;
    a second strap row disposed in said SRAM array and located adjacent to said second SRAM cell row, such that said second instance of said second polarity well extends through said second said strap row; and
    a second instance of said well contact structure disposed in said second strap row.

9. The integrated circuit of claim 8, in which:
    said strap row is free of second polarity well contact structures coupled to said second instance of said second polarity well; and
    said second strap row includes a second polarity well contact structure coupled to said second polarity wells.

* * * * *